(12) United States Patent
Kang et al.

(10) Patent No.: US 8,698,311 B2
(45) Date of Patent: Apr. 15, 2014

(54) PACKAGE SUBSTRATE AND SEMICONDUCTOR PACKAGE INCLUDING THE SAME

(75) Inventors: Tae-Gyu Kang, Chungcheongnam-do (KR); Ho-Tae Jin, Chungcheongnam-do (KR); Tae-ho Moon, Chungcheongnam-do (KR); Il-soo Choi, Chungcheongnam-do (KR); Jong-Eun Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/599,838

(22) Filed: Aug. 30, 2012

(65) Prior Publication Data

US 2013/0069229 A1 Mar. 21, 2013

(30) Foreign Application Priority Data

Sep. 19, 2011 (KR) .................. 10-2011-0093788

(51) Int. Cl.
*H01L 23/48* (2006.01)
(52) U.S. Cl.
USPC ........... 257/737; 257/664; 257/668; 257/700; 257/758; 257/786; 438/106; 438/107; 438/114; 438/120; 438/123
(58) Field of Classification Search
None
See application file for complete search history.

(56) References Cited

U.S. PATENT DOCUMENTS

| 5,686,353 A | 11/1997 | Yagi et al. |
| 2004/0238954 A1 | 12/2004 | Miyaji et al. |
| 2007/0284760 A1 | 12/2007 | Kim et al. |
| 2009/0008801 A1* | 1/2009 | Lai et al. ................. 257/782 |

FOREIGN PATENT DOCUMENTS

| JP | 2003-218150 A | 7/2003 |
| JP | 2003-309140 A | 10/2003 |
| KR | 10-0239286 B1 | 7/1996 |
| KR | 10-2007-0117117 A | 12/2007 |

\* cited by examiner

*Primary Examiner* — Kyoung Lee
(74) *Attorney, Agent, or Firm* — Harness, Dickey & Pierce, P.L.C.

(57) ABSTRACT

A package substrate may include an insulating substrate, a dummy pad, a signal pad and a plug. The dummy pad may be formed on an upper surface of the insulating substrate. The signal pad may be formed on the upper surface of the insulating substrate. The signal pad may have an upper surface protruded from an upper surface of the dummy pad. The plug may be vertically formed in the insulating substrate. The plug may have an upper end exposed through the upper surface of the insulating substrate and connected with the signal pad and the dummy pad, and a lower end exposed through a lower surface of the insulating substrate. Thus, a signal bump may accurately make contact with the protruded upper surface of the signal pad.

18 Claims, 5 Drawing Sheets

PACKAGE SUBSTRATE AND SEMICONDUCTOR PACKAGE INCLUDING THE SAME

CROSS-RELATED APPLICATION

This application claims priority under 35 USC §119 to Korean Patent Application No. 2011-93788, filed on Sep. 19, 2011 in the Korean Intellectual Property Office (KIPO), the contents of which are herein incorporated by reference in their entirety.

BACKGROUND

1. Field

Example embodiments relate to a package substrate and/or a semiconductor package including the same. More particularly, example embodiments relate to a package substrate on which a semiconductor chip is mounted via conductive bumps, and/or a semiconductor package including the package substrate.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

The semiconductor package may include a package substrate, a semiconductor chip arranged over the package substrate, and signal bumps interposed between the semiconductor chip and the package substrate. The signal bumps may electrically connect bonding pads of the semiconductor chip with signal pads of the package substrate. A passivation layer having openings configured to expose the bonding pads may be formed on a lower surface of the semiconductor chip. Thus, the passivation layer may have a lower surface, lower than that of the bonding pads.

In order to reinforce a bonding strength between the package substrate and the semiconductor chip, dummy bumps may be interposed between the package substrate and the semiconductor chip. The dummy bumps may be interposed between the passivation layer of the semiconductor chip and dummy pads of the package substrate. The dummy bumps may have a thickness substantially the same as that of the signal bumps.

Because the lower surface of the passivation layer on the semiconductor chip may protrude downwardly from the lower surface of the bonding pad and the thickness of the dummy bump formed on the passivation layer may be substantially the same as that of the signal bump formed on the bonding pad, the signal bump may not make contact with the signal pad, although the dummy bump may make contact with the dummy pad. As a result, although the dummy bump may reinforce the bonding strength between the semiconductor chip and the package substrate, the semiconductor package may frequently have electrical disconnections.

SUMMARY

At least one example embodiment provides a package substrate having a reinforced bonding strength and improved electrical connection reliability.

At least one example embodiment also provides a package substrate including the above-mentioned package substrate.

According to one example embodiment, there is provided a package substrate. The package substrate may include an insulating substrate, a dummy pad, a signal pad and a plug. The insulating substrate may have an upper surface on which a semiconductor chip may be mounted via a signal bump and a dummy bump having substantially the same thickness. The dummy pad may be formed on the upper surface of the insulating substrate. The dummy pad may be electrically connected with the dummy bump. The signal pad may be formed on the upper surface of the insulating substrate. The signal pad may be electrically connected with the signal bump. Further, the signal pad may have an upper surface protruded from an upper surface of the dummy pad. The plug may be vertically formed in the insulating substrate. The plug may have an upper end exposed through the upper surface of the insulating substrate and connected with the signal pad and the dummy pad, and a lower end exposed through a lower surface of the insulating substrate.

In an example embodiment, the signal pad may be arranged on a central portion of the upper surface of the insulating substrate. The dummy pad may be arranged on an edge portion of the upper surface of the insulating substrate.

In an example embodiment, the signal pad may be arranged on an edge portion of the upper surface of the insulating substrate. The dummy pad may be arranged on a central portion of the upper surface of the insulating substrate.

In an example embodiment, the package substrate may further include an upper insulating layer pattern formed on the upper surface of the insulating substrate to expose the signal pad and the dummy pad, and a lower insulating layer pattern formed on the lower surface of the insulating substrate to exposed the lower end of the plug.

In an example embodiment, the package substrate may further include an upper conductive layer comprising the dummy pad and the signal pad.

In an example embodiment, the package substrate may further include a first portion of the upper conductive layer including the protrusion. The thickness of the protrusion may ensure electrical connectivity between the signal bump and the signal pad.

According to one example embodiment, there is provided a semiconductor package. The semiconductor package may include a package substrate, a semiconductor chip, a signal bump and a dummy bump. The package substrate may include a dummy pad and a signal pad protruded from an upper surface of the dummy pad. The semiconductor chip may be arranged over the package substrate. The semiconductor chip may include a bonding pad, and a passivation layer having a lower surface protruded from that of the bonding pad. The signal bump may be interposed between the bonding pad of the semiconductor chip and the signal pad of the package substrate. The dummy bump may be interposed between the passivation layer of the semiconductor chip and the dummy pad of the package substrate. The signal bump and the dummy bump may have substantially the same thickness.

In an example embodiment, the signal pad and the signal bump may be arranged on a central portion of an upper surface of the insulating substrate. The dummy pad the dummy bump may be arranged on an edge portion of an upper surface of the insulating substrate.

In an example embodiment, the signal pad and the signal bump may be arranged on an edge portion of the upper surface of the insulating substrate. The dummy pad and the dummy bump may be arranged on a central portion of the upper surface of the insulating substrate.

In an example embodiment, the semiconductor package may further include a molding member formed on the upper surface of the package substrate to cover the semiconductor chip.

In an example embodiment, the semiconductor package may further include external terminals mounted on a lower surface of the package substrate. The external terminals may be electrically connected to the signal pad.

In an embodiment, the protrusion may have a thickness that ensures electrical connectivity between the signal bump and the signal pad.

According to one example embodiment, there is provided a semiconductor package. The semiconductor package may include a package substrate, a semiconductor chip, a signal bump and a dummy bump. The package substrate may include a dummy pad and a signal pad. The semiconductor chip may be arranged over the package substrate. The semiconductor chip may include a bonding pad, and a passivation layer having a lower surface protruded from that of the bonding pad. The dummy bump may be interposed between the passivation layer of the semiconductor chip and the dummy pad of the package substrate. The signal bump may be interposed between the bonding pad of the semiconductor chip and the signal pad of the package substrate. The signal bump may have a thickness greater than that of the dummy bump to make contact with the signal pad.

In an example embodiment, a thickness difference between the signal bump and the dummy bump may correspond to a thickness of a portion of the passivation layer protruded from the bonding pad.

In an example embodiment, the signal pad and the signal bump may be arranged on a central portion of an upper surface of the insulating substrate. The dummy pad the dummy bump may be arranged on an edge portion of an upper surface of the insulating substrate.

In an example embodiment, the signal pad and the signal bump may be arranged on an edge portion of the upper surface of the insulating substrate. The dummy pad and the dummy bump may be arranged on a central portion of the upper surface of the insulating substrate.

In an example embodiment, the semiconductor package may further include a molding member formed on the upper surface of the package substrate to cover the semiconductor chip.

In an example embodiment, the semiconductor package may further include external terminals mounted on a lower surface of the package substrate. The external terminals may be electrically connected to the signal pad.

In an example embodiment, the thickness of the signal bump may be sufficient to ensure electrical connectivity between the signal bump and the signal pad.

According to example embodiments, the signal pad may be upwardly protruded from the dummy pad, so that the signal bump may accurately make contact with the protruded upper surface of the signal pad. Alternatively, the thickness of the signal bump may be thicker than that of the dummy bump, so that an accurate contact between the signal bump and the signal pad may be ensured. Therefore, the semiconductor package may have a strong bonding strength and improved electrical connection reliability.

BRIEF DESCRIPTION OF THE DRAWINGS

Example embodiments will be more clearly understood from the following detailed description taken in conjunction with the accompanying drawings.

FIG. 1 is a cross-sectional view illustrating a package substrate in accordance with an example embodiment;

FIGS. 2 to 4 are cross-sectional views illustrating a method of manufacturing the package substrate in FIG. 1;

FIG. 5 is a cross-sectional view illustrating a semiconductor package including the package substrate in FIG. 1;

FIG. 6 is an enlarged cross-sectional view of a portion VI of in FIG. 5;

FIG. 7 is a cross-sectional view illustrating a package substrate in accordance with an example embodiment;

FIG. 8 is a cross-sectional view illustrating a semiconductor package including the package substrate in FIG. 7; and FIG. 9 is a cross-sectional view illustrating a semiconductor package in accordance with an example embodiment.

DETAILED DESCRIPTION OF THE EMBODIMENTS

Figure 1:
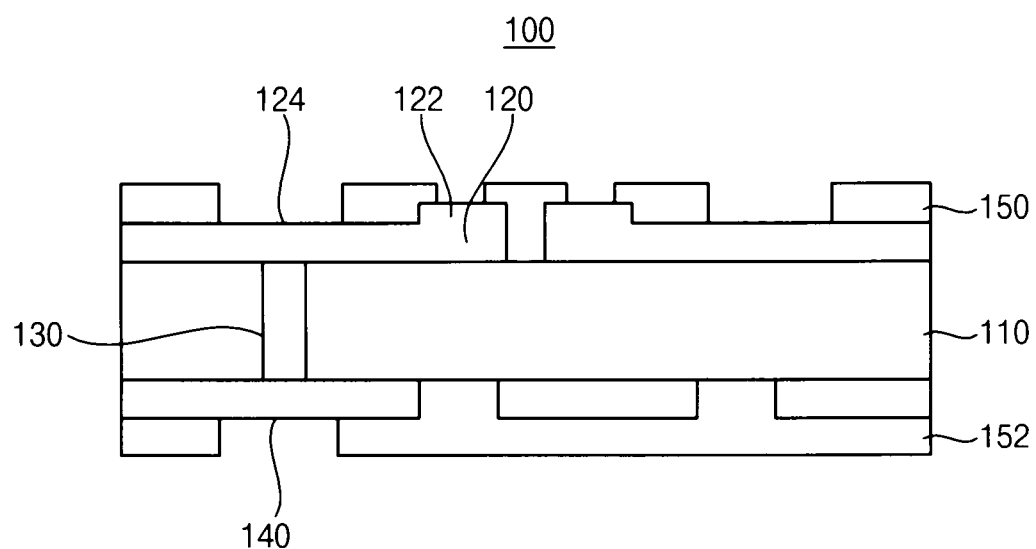
FIGS. 1 to 9 represent non-limiting, example embodiments as described herein.

Various example embodiments will be described more fully hereinafter with reference to the accompanying drawings, in which some example embodiments are shown. It should be understood, however, that there is no intent to limit example embodiments to the particular forms disclosed, but to the contrary, example embodiments are to cover all modifications, equivalents, and alternatives falling within the scope of example embodiments. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Package Substrate

FIG. 1 is a cross-sectional view illustrating a package substrate in accordance with an example embodiment.

Referring to FIG. 1, a package substrate 100 of this example embodiment may include an insulating substrate 110, an upper signal pad 120, a dummy pad 124, a plug 130 and a lower signal pad 140.

In this example embodiment, the insulating substrate 110 may include an insulating material. A semiconductor chip (not shown) may be mounted on an upper surface of the insulating substrate 110 via a signal bump (not shown) and a dummy bump (not shown). The semiconductor chip may include a bonding pad (not shown) and a passivation layer (not shown). Thus, the package substrate 100 may be used for packaging the semiconductor chip that may include the bonding pad may be arranged on a central portion of the semiconductor chip. Therefore, the passivation layer may have a lower surface, lower than that of the bonding pad. Further, the thickness of the signal bump may be substantially the same thickness as that of the dummy bump. External terminals (not shown) may be mounted on a lower surface of the insulating substrate 110.

The upper signal pad 120 may be arranged on a central portion of the upper surface of the insulating substrate 110. In this example embodiment, the upper signal pad 120 may have a protrusion 122. The protrusion 122 may be formed on an upper surface of the upper signal pad 120. The signal bump may make contact with the protrusion 122 of the upper signal pad 120.

The dummy pad 124 may be arranged on an edge portion of the upper surface of the insulating substrate 110. In the example embodiment, the dummy pad 124 may have an upper surface substantially coplanar with that of the upper signal pad 120. Thus, the upper surface of the dummy pad 124 may be lower than the upper surface of the protrusion 122. The dummy bump may make contact with the dummy pad 124. The dummy pad 124 may be electrically connected with the upper signal pad 120.

In the example embodiment, the dummy bump may be formed on a lower surface of the passivation layer. The signal bump may be formed on a lower surface of the bonding pad, lower than the lower surface of the passivation layer. Therefore, a lower surface of the signal bump, which may have the thickness substantially the same as that of the dummy bump, may be positioned higher than a lower surface of the dummy bump. As a result, the lower surface of the signal bump may not make contact with the upper signal pad 120.

In contrast, according to the example embodiment, because the upper signal pad 120 may have the protrusion 122, the lower surface of the signal bump may accurately make contact with the protrusion 122. That is, the protrusion 122 may serve to compensate for a difference between a gap between the passivation layer and the dummy pad 124, and a gap between the bonding pad and the upper signal pad 120. Thus, the protrusion 122 may have a thickness substantially the same as the gap difference. Particularly, the thickness of the protrusion 122 may be substantially the same as a thickness of a portion of the passivation layer protruding from the bonding pad.

A plug 130 may be formed in the insulating substrate 110. The plug 130 may have an upper end making contact with the upper signal pad 120, and the plug 130 may have a lower end exposed through the lower surface of the insulating substrate 110. The external terminals may be mounted on the lower end of the plug 130.

The lower signal pad 140 may be arranged on the lower surface of the insulating substrate 110. The lower signal pad 140 may be electrically connected with the lower end of the plug 130.

An upper insulating layer pattern 150 may be formed on the upper surface of the insulating substrate 110. The upper insulating layer pattern 150 may have openings configured to expose the upper signal pad 120 and the dummy pad 124.

A lower insulating layer pattern 152 may be formed on the lower surface of the insulating substrate 110. The lower insulating layer pattern 152 may have openings configured to expose the lower signal pad 140.

According to this example embodiment, the upper signal pad 120 may have the protrusion 122 higher than the dummy pad 124, so that the signal bump having the thickness substantially the same as that of the dummy bump may accurately make contact with the protrusion 122.

Figure 2:
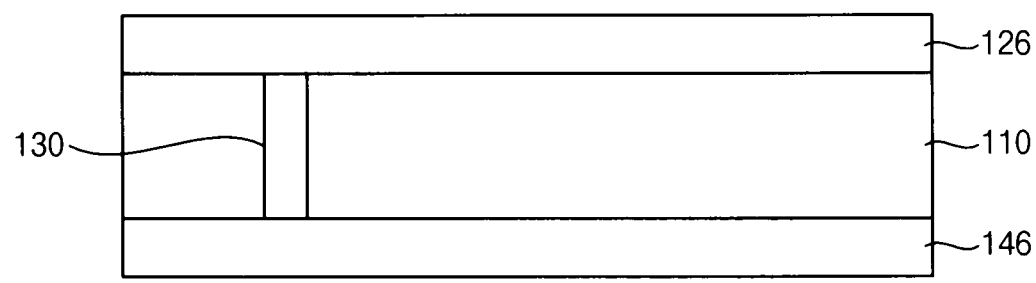
Figure 3:
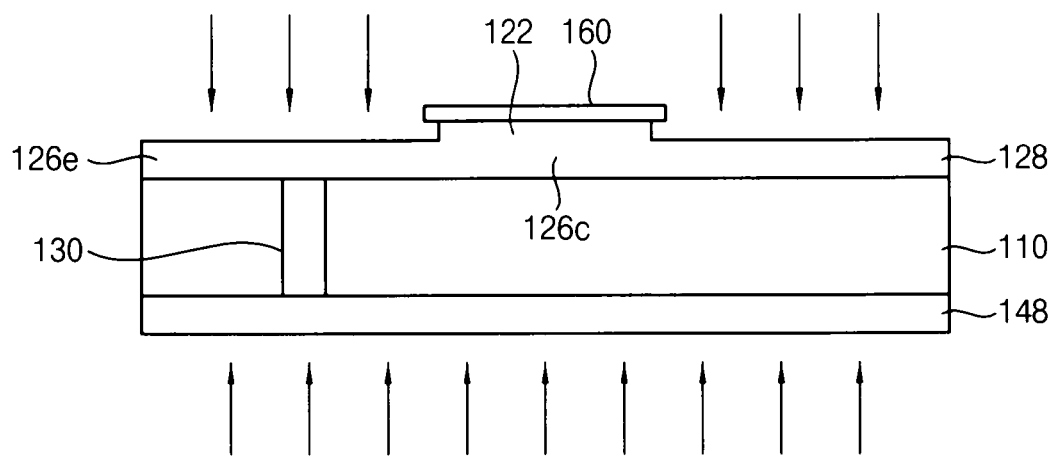
Figure 4:
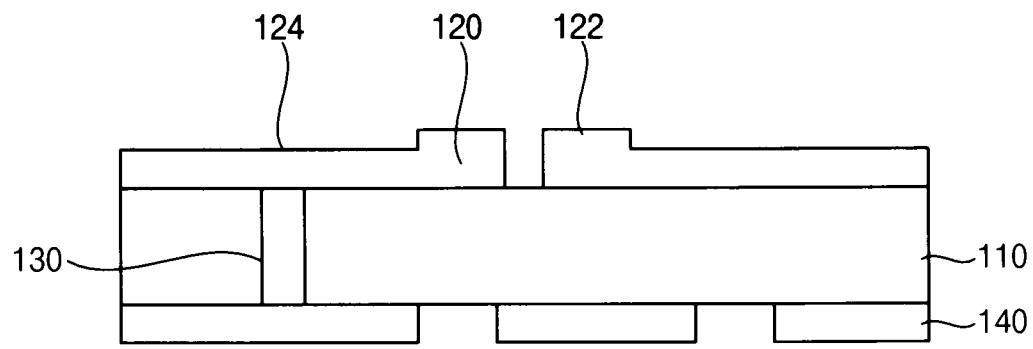

FIGS. 2 to 4 are cross-sectional views illustrating a method of manufacturing the package substrate in FIG. 1.

Referring to FIG. 2, a plug 130 may be vertically oriented in the insulating substrate 110. An upper conductive layer 126 may be formed on the upper surface of the insulating substrate 110. A lower conductive layer 146 may be formed on the lower surface of the insulating substrate 110. The upper conductive layer 126 and the lower conductive layer 146 may be connected with each other via the plug 130. In this example embodiment, the upper conductive layer 126 and the lower conductive layer 146 may include a metal layer such as a copper layer.

Referring to FIG. 3, a mask 160 may be arranged over a central portion 126c of the upper conductive layer 126. The upper conductive layer 126 may be half-etched using the mask 160 as an etch mask to form an upper conductive layer pattern 128. In this example embodiment, because the central portion 126c of the upper conductive layer 126 may be covered with the mask 160, the central portion 126c of the upper conductive layer 126 may not be removed by the half-etching process. In contrast, an edge portion 126e of the upper conductive layer 126 may be removed by the half-etching process, so that an etched edge portion 126e of the upper conductive layer 126 may have a thickness of about 0.5 times a thickness of the central portion 126c of the upper conductive layer 126. Thus, the upper conductive layer pattern 128 may have the central protrusion 122. After completing the half-etching process, the mask 160 may then be removed.

In contrast, all portions of the lower conductive layer 146 may be half-etched to form a lower conductive layer pattern 148. The lower conductive layer pattern 148 may have a thickness of about 0.5 times that of the lower conductive layer 146.

Referring to FIG. 4, the upper conductive layer pattern 128 may be patterned to form the upper signal pad 120 and the dummy pad 124. In this example embodiment, the upper signal pad 120 may have the protrusion 122 higher than the upper surface of the dummy pad 124. The upper signal pad 120 may be connected to the plug 130.

The lower conductive layer pattern 148 may be patterned to form the lower signal pad 140. The lower signal pad 140 may be connected to the plug 130. Therefore, the upper signal pad 120 and the lower signal pad 140 may be connected with each other via the plug 130.

The upper insulating layer pattern 150 may be formed on the upper surface of the insulating substrate 110. In this example embodiment, the upper insulating layer pattern 150 may have the openings configured to expose the upper signal pad 120 and the dummy pad 124. The lower insulating layer pattern 152 may be formed on the lower surface of the insulating substrate 110 to complete the package substrate 100 in FIG. 1. In this example embodiment, the lower insulating layer pattern 152 may have the openings configured to expose the lower signal pad 140.

Figure 5:
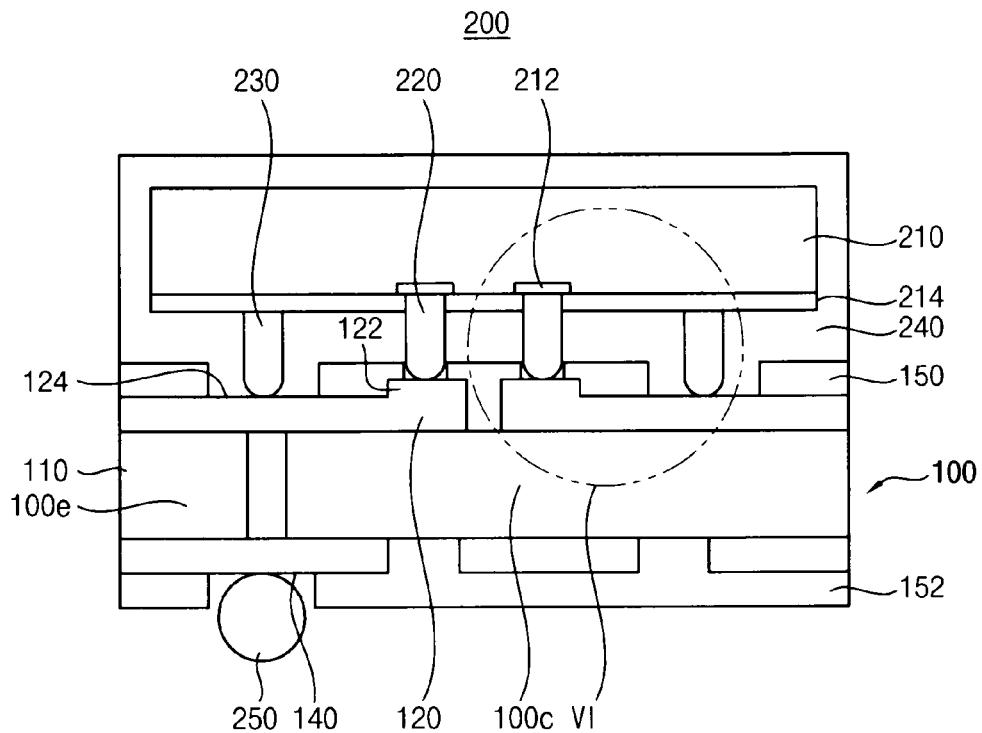
Figure 6:
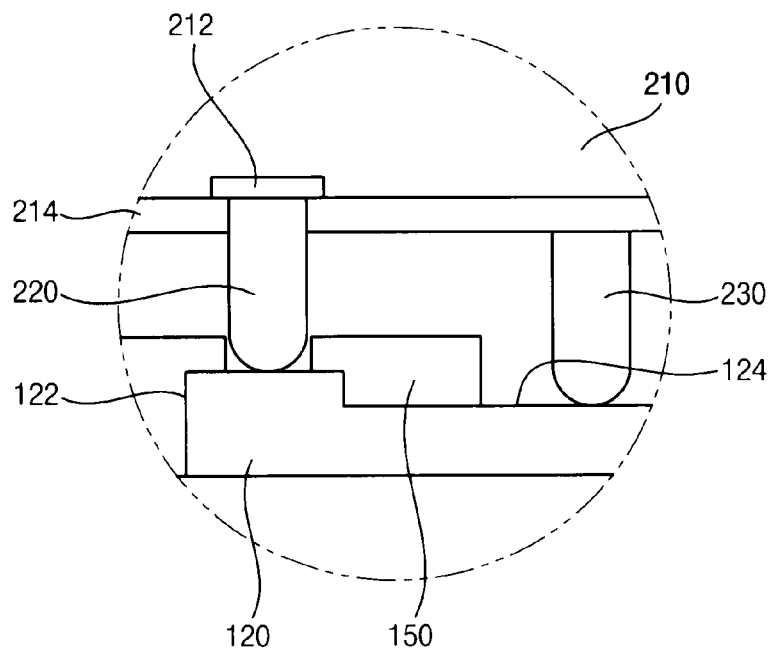

FIG. 5 is a cross-sectional view illustrating a semiconductor package including the package substrate in FIG. 1, and FIG. 6 is an enlarged cross-sectional view of a portion VI of in FIG. 5.

Referring to FIGS. 5 and 6, a semiconductor package 200 of this example embodiment may include a package substrate 100, a semiconductor chip 210, a signal bump 220, a dummy bump 230, a molding member 240 and external terminals 250. The package substrate 110 may have an edge portion 100e and a central portion 100c.

In this example embodiment, the package substrate 100 may include elements substantially the same as those of the package substrate 100 in FIG. 1. Thus, the same reference numerals may refer to the same elements and any further illustrations with respect to the same element may be omitted herein for brevity.

The semiconductor chip 210 may be arranged over the package substrate 100. The semiconductor chip 210 may have a bonding pad 212. In this example embodiment, the bonding pad 212 may be arranged on a central portion of a lower surface of the semiconductor chip 210. A passivation layer 214 may be formed on the lower surface of the semiconductor chip 210. The passivation layer 214 may have openings configured to expose the bonding pad 212. The passivation layer 214 may have a lower surface, lower than that of the bonding pad 212. Thus, a distance between the lower surface of the bonding pad 212 and the signal pad 120 may be longer than a distance between the lower surface of the passivation layer 214 and the dummy pad 124.

The signal bump 220 may be interposed between the semiconductor chip 210 and the package substrate 100. In this example embodiment, the signal bump 220 may be interposed between the bonding pad 212 of the semiconductor chip 210 and the protrusion 122 of the upper signal pad 120 of the package substrate 100. Electrical signals may be transmitted through the signal bump 220. Thus, the bonding pad 212 and the upper signal pad 120 may be electrically connected with each other via the signal bump 220.

In this example embodiment, the signal bump 220 may have a thickness substantially the same as that of the dummy bump 230. As mentioned above, because the distance between the lower surface of the bonding pad 212 and the signal pad 120 may be longer than the distance between the lower surface of the passivation layer 214 and the dummy pad 124, the signal bump 220 may not make contact with the upper signal pad 120. However, according to this example embodiment, the signal bump 220 may make contact with the protrusion 122, functioning to compensate for the distance difference. Therefore, an electrical connection between the signal bump 220 and the upper signal pad 120 may be ensured by the protrusion 122.

The dummy bump 230 may be interposed between the semiconductor chip 210 and the package substrate 100. In this example embodiment, the dummy bump 230 may be interposed between the passivation layer 214 of the semiconductor chip 210 and the dummy pad 124 of the package substrate 100. Thus, the electrical signals may not be transmitted through the dummy bump 230. The dummy bump 230 may reinforce a bonding strength between the semiconductor chip 210 and the package substrate 100.

The molding member 240 may be disposed on the upper surface of the package substrate 100 to cover the semiconductor chip 210. In this example embodiment, the molding member 240 may include an epoxy molding compound (EMC).

The external terminals 250 may be mounted on the lower signal pad 140 of the package substrate 100. In this example embodiment, the external terminals 250 may include solder balls.

According to this example embodiment, the signal bump 220, having a thickness substantially the same as that of the dummy bump 230, may make contact with the protrusion 122 of the signal pad 120. Thus, the electrical connection between the semiconductor chip 210 and the package substrate 110 may be ensured by the protrusion 122. As a result, the semiconductor package 200 may have improved electrical connection reliability.

Figure 7:
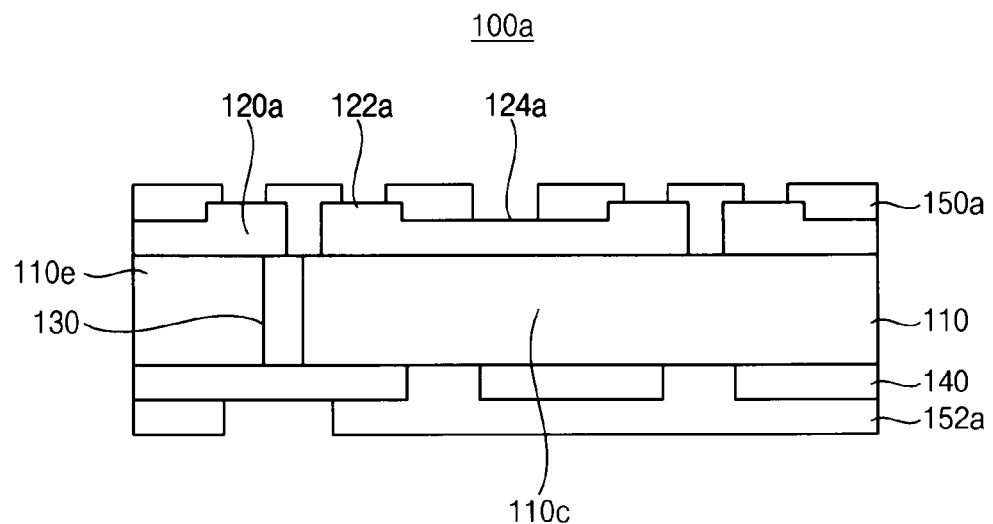

FIG. 7 is a cross-sectional view illustrating a package substrate 110a in accordance with example an embodiment.

A package substrate 100a of this example embodiment may include elements substantially the same as those of the package substrate 100 in FIG. 1 except for positions of a signal pad 120a and a dummy pad 124a. Thus, the same reference numerals may refer to the same elements and any further illustrations with respect to the same element may be omitted herein for brevity.

Referring to FIG. 7, the package substrate 100a of this example embodiment may include a signal pad 120a and a dummy pad 124a. The signal pad 120a may be arranged on the edge portion 110e of the upper surface of the insulating substrate 110. In contrast, the dummy pad 124a may be arranged on the central portion 110c of the upper surface of the insulating substrate 110. That is, the package substrate 100a may be used for packaging a semiconductor chip having bonding pads that may be arranged on an edge portion of the semiconductor chip.

A method of manufacturing the package substrate 100a may include processes substantially the same as the method of manufacturing the package substrate 100 illustrated with reference to FIGS. 2 to 4 except for a process for arranging the mask 160 over the edge portion of the insulating substrate 100. Thus, any further illustrations with respect to the method of manufacturing the package substrate 100a may be omitted herein for brevity.

Figure 8:
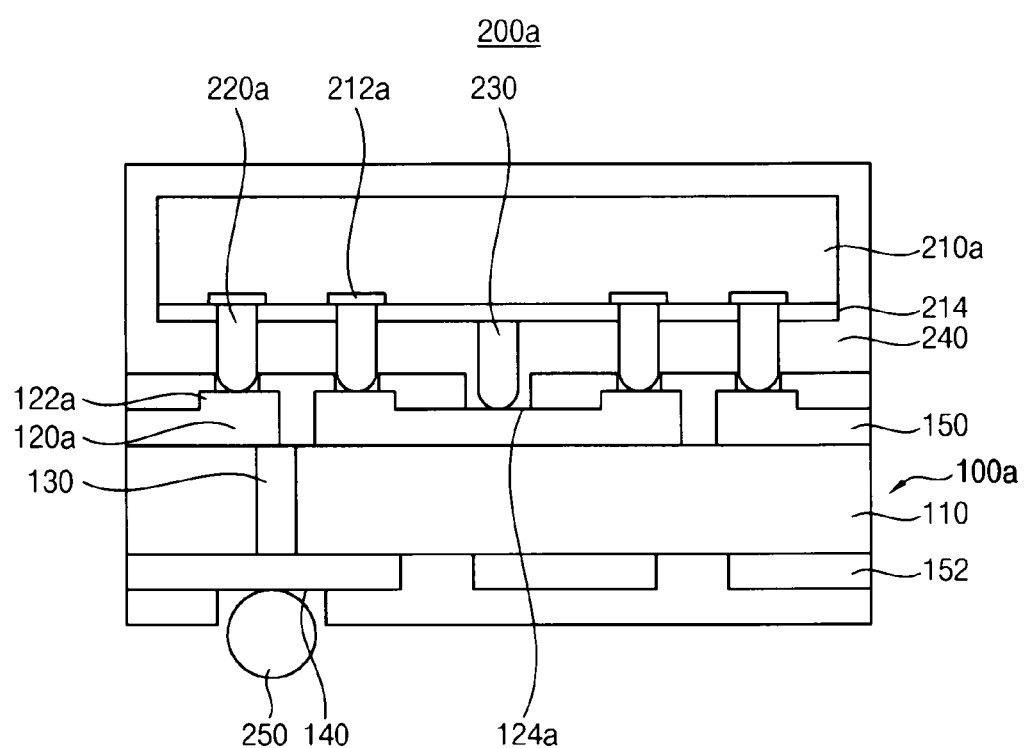

FIG. 8 is a cross-sectional view illustrating a semiconductor package 200a including the package substrate 110a in FIG. 7.

A semiconductor package 200a of this example embodiment may include elements substantially the same as those of the semiconductor package 200 in FIG. 5 except for a semiconductor chip 210a and a package substrate 100a. Thus, the same reference numerals may refer to the same elements and any further illustrations with respect to the same element may be omitted herein for brevity.

Referring to FIG. 8, the semiconductor package 200a of this example embodiment may include a bonding pad 212a. The bonding pad 212a may be arranged on an edge portion of the lower surface of the semiconductor chip 210a. Thus, a signal bump 220a may be interposed between edge portions of a package substrate 100a and the semiconductor chip 210a. In contrast, a dummy bump 230a may be interposed between central portions of the package substrate 100a and the semiconductor chip 210a.

Figure 9:
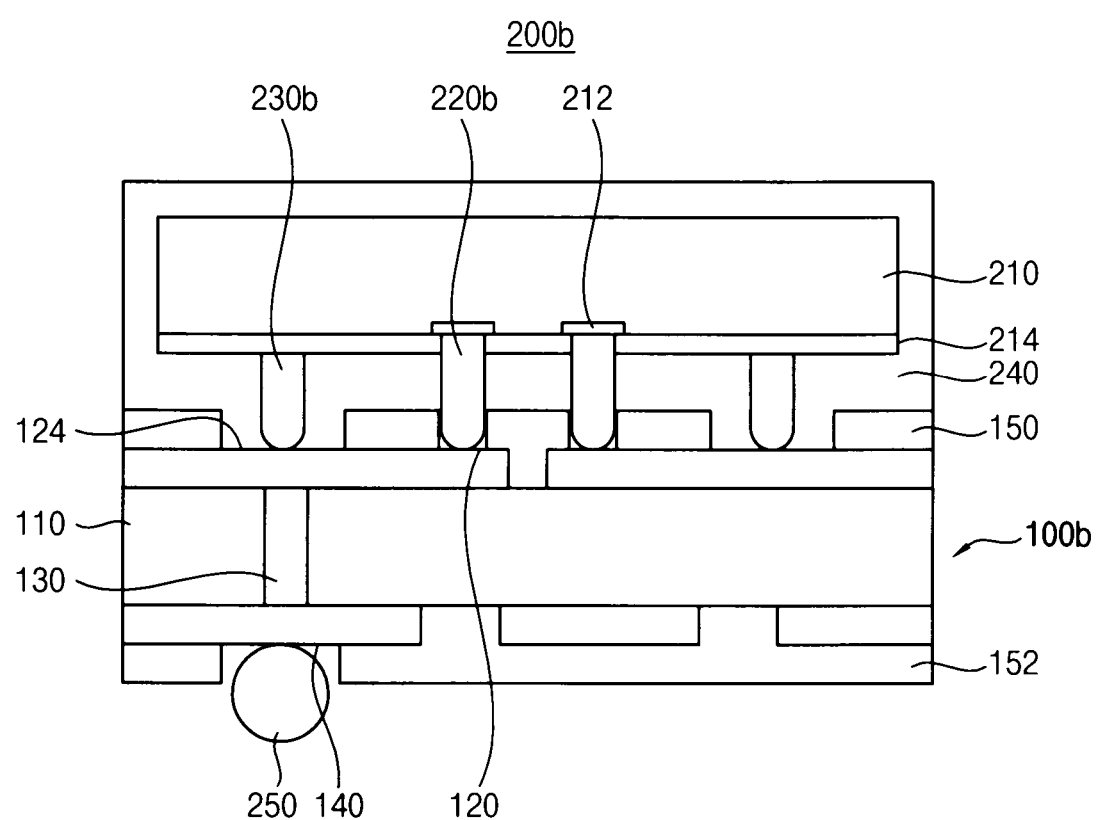

FIG. 9 is a cross-sectional view illustrating a semiconductor package in accordance with an example embodiment.

Referring to FIG. 9, a semiconductor package 200b of this example embodiment may include a package substrate 100b, a semiconductor chip 210, a signal bump 220b, a dummy bump 230b, a molding member 240 and external terminals 250.

In this example embodiment, the semiconductor chip 210, the molding member 240 and the external terminals 250 may be substantially the same as the semiconductor chip 210, the molding member 240 and the external terminals 250 in FIG. 6. Thus, any further illustrations with respect to the semiconductor chip 210, the molding member 240 and the external terminals 250 may be omitted herein for brevity.

In this example embodiment, the package substrate 100b may not have a protrusion. That is, the protrusion may not be formed on the upper surface of the upper signal pad 120. Thus, the upper surface of the upper signal pad 120 may be positioned substantially coplanar with the upper surface of the dummy pad 124.

The signal bump 220b may be interposed between the semiconductor chip 210 and the package substrate 100b. In this example embodiment, the signal bump 220b may be interposed between the bonding pad 212 of the semiconductor chip 210 and the upper signal pad 120 of the package substrate 100b. Electrical signals may be transmitted through the signal bump 220b.

In this example embodiment, the signal bump 220b may have a thickness greater than that of the dummy bump 230b. As mentioned above, because the distance between the lower surface of the bonding pad 212 and the signal pad 120 may be longer than the distance between the lower surface of the passivation layer 214 and the dummy pad 124, the signal bump 220b may not make contact with the upper signal pad 120. However, according to this example embodiment, the signal bump 220b having the thickness greater than that of the dummy bump 230b may make contact with the upper signal pad 120.

The dummy bump 230b may be interposed between the semiconductor chip 210 and the package substrate 100b. In this example embodiment, the dummy bump 230b may be interposed between the passivation layer 214 of the semiconductor chip 210 and the dummy pad 124 of the package substrate 100b. The dummy bump 230b may reinforce a bonding strength between the semiconductor chip 210 and the package substrate 100b.

According to this example embodiment, the signal bump 220b having the thickness greater than that of the dummy bump 230b may make contact with the signal pad 120. Thus, the electrical connection between the semiconductor chip 210 and the package substrate 100b may be ensured by the thick signal bump 220b. As a result, the semiconductor package 200b may have improved electrical connection reliability.

According to this example embodiment, the signal pad 120 may be upwardly protruded from the dummy pad 124, so that the signal bump 220b may accurately make contact with the protrusion 122 on the upper surface of the signal pad 120. Alternatively, the thickness of the signal bump 220b may be thicker than that of the dummy bump 230b, so that an accurate contact between the signal bump 220b and the signal pad 120 may be ensured. Therefore, the semiconductor package 200b may have a strong bonding strength and improved electrical connection reliability.

The foregoing is illustrative of example embodiments and is not to be construed as limiting thereof. Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A package substrate comprising:
an insulating substrate having an upper surface on which a semiconductor chip is arranged via a signal bump and a dummy bump, the signal bump and the dummy bump having substantially the same thickness;
a dummy pad having an upper surface, the dummy pad on the upper surface of the insulating substrate and connected to the dummy bump;
a signal pad formed on the upper surface of the insulating substrate and connected to the signal bump, the signal pad having a protrusion that has an upper surface higher than the upper surface of the dummy pad; and
a plug having an upper end and a lower end, the upper end exposed through the upper surface of the insulating substrate and electrically connected with the signal pad and the dummy pad, and the lower end exposed through a lower surface of the insulating substrate.

2. The package substrate of claim 1, wherein the signal pad is arranged on a central portion of the upper surface of the insulating substrate, and the dummy pad is arranged on an edge portion of the upper surface of the insulating substrate.

3. The package substrate of claim 1, wherein the signal pad is arranged on an edge portion of the upper surface of the insulating substrate, and the dummy pad is arranged on a central portion of the upper surface of the insulating substrate.

4. The package substrate of claim 1, further comprising:
an upper insulating layer pattern formed on the upper surface of the insulating substrate and configured to expose the signal pad and the dummy pad; and a lower insulating layer pattern formed on the lower surface of the insulating substrate and configured to expose the lower end of the plug.

5. The package substrate of claim 1, further comprising:
an upper conductive layer, the upper conductive layer including the dummy pad and the signal pad.

6. The package substrate of claim 5, wherein the protrusion is formed of a first portion of the upper conductive layer and the thickness of the protrusion ensures electrical connectivity between the signal bump and the signal pad.

7. A semiconductor package comprising:
a package substrate including a dummy pad having an upper surface and a signal pad, the signal pad having a protrusion, the protrusion having an upper surface higher than the upper surface of the dummy pad;
a semiconductor chip arranged over an upper surface of the package substrate, the semiconductor chip including a bonding pad having a lower surface and a passivation layer having a lower surface lower than the lower surface of the bonding pad;
a signal bump having a thickness, the signal bump being interposed between the bonding pad of the semiconductor chip and the signal pad of the package substrate; and
a dummy bump interposed between the passivation layer of the semiconductor chip and the dummy pad of the package substrate, the dummy bump having a thickness substantially the same as the thickness of the signal bump.

8. The semiconductor package of claim 7, wherein the signal pad and the signal bump are arranged on a central portion of the upper surface of the package substrate, and the dummy pad and the dummy bump are arranged on an edge portion of the upper surface of the package substrate.

9. The semiconductor package of claim 7, wherein the signal pad and the signal bump are arranged on an edge portion of the upper surface of the package substrate, and the dummy pad and the dummy bump are arranged on a central portion of the upper surface of the package substrate.

10. The semiconductor package of claim 7, further comprising:
a molding member disposed on the upper surface of the package substrate to cover the semiconductor chip.

11. The semiconductor package of claim 7, further comprising:
external terminals mounted on a lower surface of the package substrate and electrically connected with the signal pad.

12. The semiconductor substrate of claim 7, wherein the protrusion has a thickness that ensures electrical connectivity between the signal bump and the signal pad.

13. A semiconductor package comprising:
a package substrate including a dummy pad and a signal pad;
a semiconductor chip arranged over an upper surface of the package substrate, the semiconductor chip including a bonding pad having a lower surface and a passivation layer that has a lower surface, the lower surface of the passivation layer being lower than the lower surface of the bonding pad;
a dummy bump having a thickness, the dummy bump being interposed between the passivation layer of the semiconductor chip and the dummy pad of the package substrate; and
a signal bump interposed between the bonding pad of the semiconductor chip and the signal pad of the package substrate, the signal bump having a thickness greater than the thickness of the dummy bump, such that the signal bump contacts with the signal pad,
wherein a thickness difference between the thickness of the signal bump and the thickness of the dummy bump corresponds to a thickness of a portion of the passivation layer protruding from the bonding pad.

14. The semiconductor package of claim 13, wherein the signal pad and the signal bump are arranged on an edge portion of the upper surface of the package substrate, and the dummy pad and the dummy bump are arranged on a central portion of the upper surface of the package substrate.

15. The semiconductor package of claim 13, further comprising:
a molding member disposed on the upper surface of the package substrate to cover the semiconductor chip.

16. The semiconductor substrate of claim 13, wherein the thickness of the signal bump is sufficient to ensure electrical connectivity between the signal bump and the signal pad.

17. A semiconductor package comprising:
a package substrate including a dummy pad and a signal pad;
a semiconductor chip arranged over an upper surface of the package substrate, the semiconductor chip including a bonding pad having a lower surface and a passivation layer that has a lower surface, the lower surface of the passivation layer being lower than the lower surface of the bonding pad;
a dummy bump having a thickness, the dummy bump being interposed between the passivation layer of the semiconductor chip and the dummy pad of the package substrate; and
a signal bump interposed between the bonding pad of the semiconductor chip and the signal pad of the package substrate, the signal bump having a thickness greater than the thickness of the dummy bump, such that the signal bump contacts with the signal pad,
wherein the signal pad and the signal bump are arranged on a central portion of the upper surface of the package substrate, and the dummy pad and the dummy bump are arranged on an edge portion of the upper surface of the package substrate.

18. A semiconductor package comprising:
a package substrate including a dummy pad and a signal pad;
a semiconductor chip arranged over an upper surface of the package substrate, the semiconductor chip including a bonding pad having a lower surface and a passivation layer that has a lower surface, the lower surface of the passivation layer being lower than the lower surface of the bonding pad;
a dummy bump having a thickness, the dummy bump being interposed between the passivation layer of the semiconductor chip and the dummy pad of the package substrate;
a signal bump interposed between the bonding pad of the semiconductor chip and the signal pad of the package substrate, the signal bump having a thickness greater than the thickness of the dummy bump, such that the signal bump contacts with the signal pad, and
external terminals mounted on a lower surface of the package substrate and electrically connected with the signal pad.

* * * * *